United States Patent [19]
Lee et al.

[11] Patent Number: 6,106,664
[45] Date of Patent: Aug. 22, 2000

[54] CLAMP FOR AFFIXING A WAFER IN AN ETCHING CHAMBER

[75] Inventors: Ray Lee, Taipei; Shih-Po Lin, Taipei Hsien; Jim Ho, Hsinchu; Ming-Hong Lin, Kaohsiung Hsien, all of Taiwan

[73] Assignees: ProMOS Technologies, Inc.; Mosel Vitelic Inc., both of Hsinchu, Taiwan; Siemens AG, Munich, Germany

[21] Appl. No.: 09/140,117

[22] Filed: Aug. 25, 1998

[30] Foreign Application Priority Data

Jul. 30, 1998 [TW] Taiwan ................................. 87212392

[51] Int. Cl.[7] ...................................................... C23F 1/02
[52] U.S. Cl. ............................................................ 156/345
[58] Field of Search ............................. 156/345; 118/720, 118/721, 728, 715

[56] References Cited

U.S. PATENT DOCUMENTS 5,326,725  7/1994  Sherstinsky et al. .................. 437/225
5,855,687  1/1999  Du Bois et al. ........................ 118/729
5,868,847  2/1999  Chen et al. ............................ 118/715

*Primary Examiner*—Richard Bueker
*Assistant Examiner*—Erin Fieler
*Attorney, Agent, or Firm*—Thomas, Kayden, Horstemeyer & Risley

[57] ABSTRACT

A clamp affixes a wafer by entirely covering the edge of the wafer, wherein the radius of the inner surface of the clamp is about 1 mm shorter than the radius of the wafer. Besides, there are four pairs of square protuberances distributed even along the inner surface of the clamp for affixing the wafer, wherein the square protuberances only hold the edge of the device regions of the wafer. Even though the wafer is slightly off position, the square protuberances are still able to affix the wafer properly. In addition, the lifetime of the clamp of the invention is about 100 hours, which is two times of a conventional clamp, so that the cost is reduced.

10 Claims, 2 Drawing Sheets

CLAMP FOR AFFIXING A WAFER IN AN ETCHING CHAMBER

CROSS-REFERENCE TO RELATED APPLICATION

This application claims the priority benefit of Taiwan application serial no. 87,212,392, filed Jul. 30, 1998, the full disclosure of which is incorporated herein by reference.

BACKGROUND OF THE INVENTION

1. Field of the Invention

This invention relates to a device used in a chamber for affixing a wafer, and more particularly, to a device that protects the edge of a wafer and also affixes the wafer during a fabrication process.

2. Description of Related Art

FIG. 1A is a structural diagram showing a clamp used to affix a wafer, and FIG. 1B is a locally magnified diagram of the area 126 shown in FIG. 1A.

Referring to both FIGS. 1A and 1B, while an etching process is performed in a MXP oxidation chamber, a wafer 100 is placed on a stage (not shown in figures), wherein the wafer 100 contains device regions 102. The stage contains ducts used to feed gas to the back of the wafer 100 for cooling the wafer 100 during the etching process.

The back of the wafer 100 has to stick tight to the ducts to prevent the cooling gas leaking into the chamber, since the leaked cooling gas in the chamber interrupts the reaction and further damages the wafer. Hence, A conventional method for affixing the wafer 100 is to utilize a clamp 120 on the top of the wafer 100, wherein the radius of the inner surface 122 of the clamp 120 is longer than the radius of the wafer 100. The difference between the radius of the wafer 100 and the radius of the inner surface 122 of the clamp 120 is d1, as shown in FIG. 1B. that exposes the edge of the wafer 100. There are 12 sharp protuberances 124 protuberating toward the center of the clamp, wherein the distance d2 from the tip of the sharp protuberance 124 to the inner surface 122 of the clamp 120 is about 3 mm. and wherein d2 is greater than d2. Conventionally, those sharp protuberances 124 of the clamp 120 are used to affix the wafer 100.

FIGS. 2A and 2B are structural diagrams showing the wafer used in a deep trench mask opening (DTMO) process and a deep trench (DT) etching process performed in a MXP oxidation chamber, wherein the DTMO process is a pre-step of the DT etching process.

Referring to FIG. 2A, an oxide layer 202 and a silicon nitride layer 204 are formed on a substrate 200. By using a patterned photoresist layer 206, the pattern 208 on the photoresist layer 206 is transferred to the silicon nitride layer 204 and the oxide layer 202, wherein the pattern 208 is used to form deep trenches. Because the edge 210 of the substrate 200 is not covered by the photoresist layer 206, the silicon nitride layer 204 and the oxide layer 202 located on the edge 210 of the substrate 200 are moved by the patterning process used to transfer pattern 208 onto the substrate 200.

Referring next to FIG. 2B, a DT etching process is performed on the substrate 200 by using the patterned silicon nitride layer 204 and oxide layer 202 as etching masks to form deep trenches 208' on the substrate 200. In the mean time, the etching process removes a portion of the edge 210 of the substrate 200 as well, wherein the edge 210' after the etching process is shown in FIG. 2B.

According to the foregoing, the removal of the edge 210 of the substrate 200 by the foregoing etching process generates a large amount of particles that causes defects on the follow-up processes or even abandoning the entire wafer. Because a conventional clamp cannot provide enough protection to the edge 210 of the substrate 200, the occurrence of loss caused in an etching process cannot be avoided.

Furthermore, as referring to FIG. 1B, the sharp protuberances 124 for affixing a wafer 100 block some of the device regions 102 that degrades the effect of processes over the neighboring area. Moreover, those sharp protuberances 124 further worsens the equability of the plasma generated during the etching process that degrades the performance of processes over the blocked area, and the neighboring area as well.

There is another conventional clamp that provides protection to the edge of a wafer without using sharp protuberances but covering the entire edge of a wafer by shortening the radius of the inner surface. Because the device regions on the wafer cannot be covered, the clamp can only cover a ring-type area that is about 1 mm in width on the edge of the wafer.

Even though the foregoing clamp provides pretty good protection to the wafer to prevent the occurrence of peeling problem in an etching process, the tiny affixed area cannot provide enough stress to hold the wafer in position. Once the wafer is slightly off position, the cooling gas leaking from the back of the wafer interrupts the ongoing process.

In addition, even though the wafer is held still during the process, the loss of the clamp caused by the etching process enlarges the radius of the inner surface of the clamp. After being used in the chamber for a period of about 40 hours, the clamp can no longer affix the wafer properly. Because of the short lifetime of the clamp, the cost of the clamp, and the time wasted by replacing the clamp frequently, the production is seriously degraded.

SUMMARY OF THE INVENTION

It is therefore an objective of the present invention to provide a clamp for affixing a wafer. The clamp according to the invention can efficiently affix the wafer, and further prevent the edge of the wafer from being over etched as well. The clamp according to the invention is also able to affix the wafer even under the case that the wafer is slightly off position. Furthermore, the clamp according to the invention doesn't affect the equability of the plasma generated by the etching process, so the performance of the etching process over the wafer is improved equally. Plus, the lifetime of the clamp is expanded to reduce the cost and time used on replacing the clamp.

In accordance with the foregoing and other objectives of the present invention, the invention provides a clamp for affixing a wafer by entirely covering the edge of the wafer, wherein the radius of the inner surface of the clamp is about 1 mm shorter than the radius of the wafer. Besides, there are four pairs of square protuberances distributed even along the inner surface of the clamp for affixing the wafer, wherein the square protuberances only hold the edge of the device regions of the wafer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
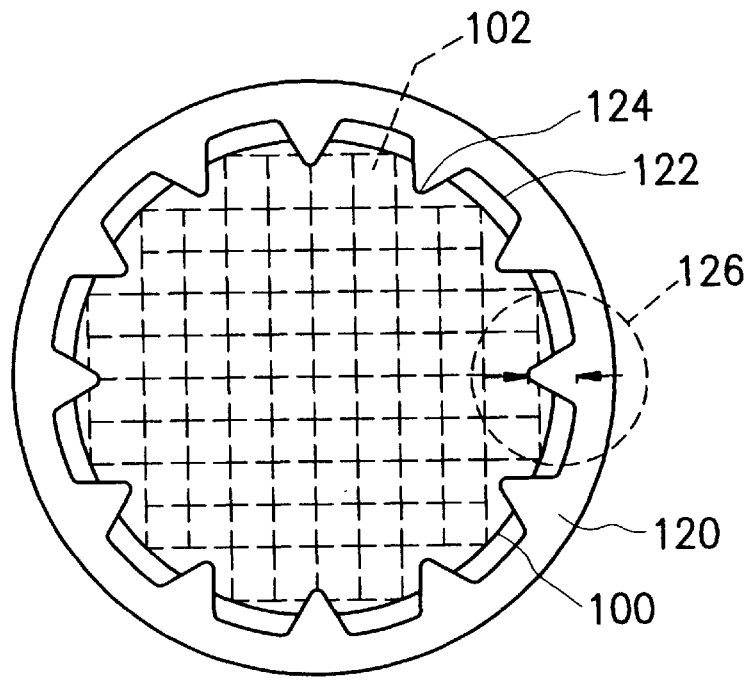
FIG. 1A is a schematic diagram showing a conventional clamp.
Figure 1B:
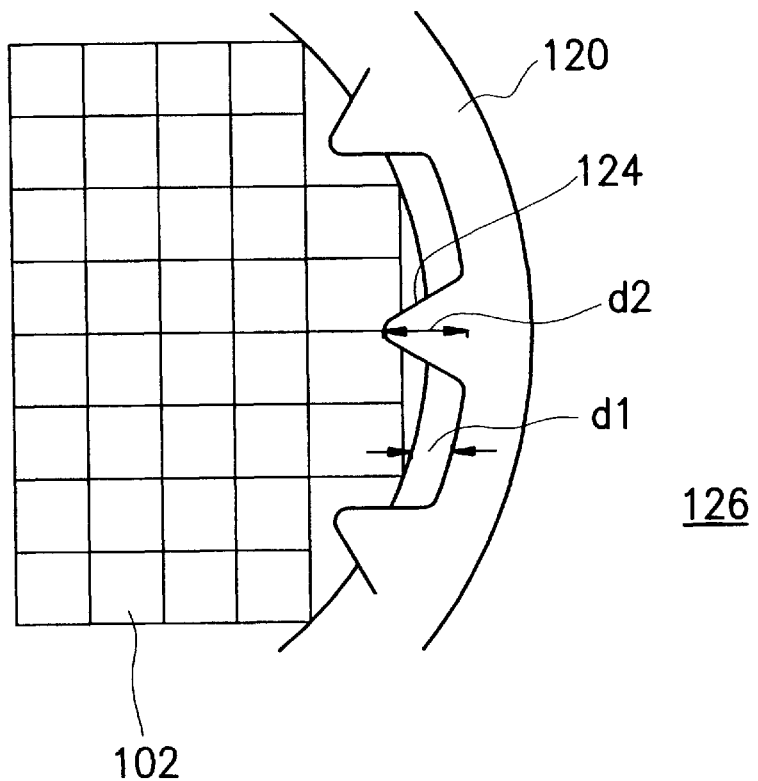
FIG. 1B is a schematic diagram showing a locally magnified region 126 as shown in FIG. 1A.
Figure 2A:
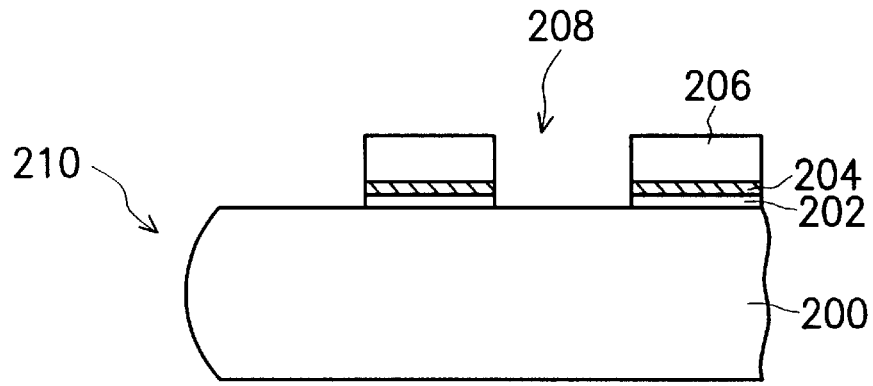
FIGS. 2A and 2B are schematic diagram showing a wafer affixed by a conventional clamp during a DTMO process and a DT etching process performed in a MXP chamber.
Figure 2B:
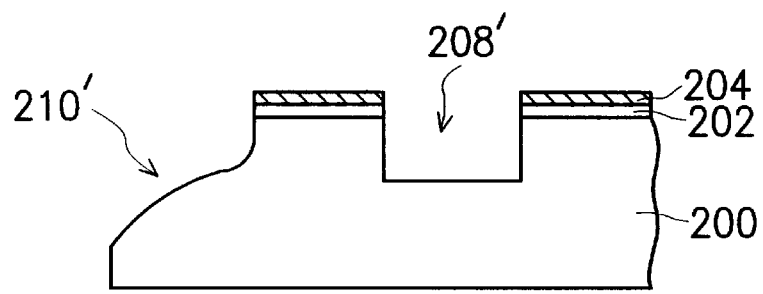
Figure 3:
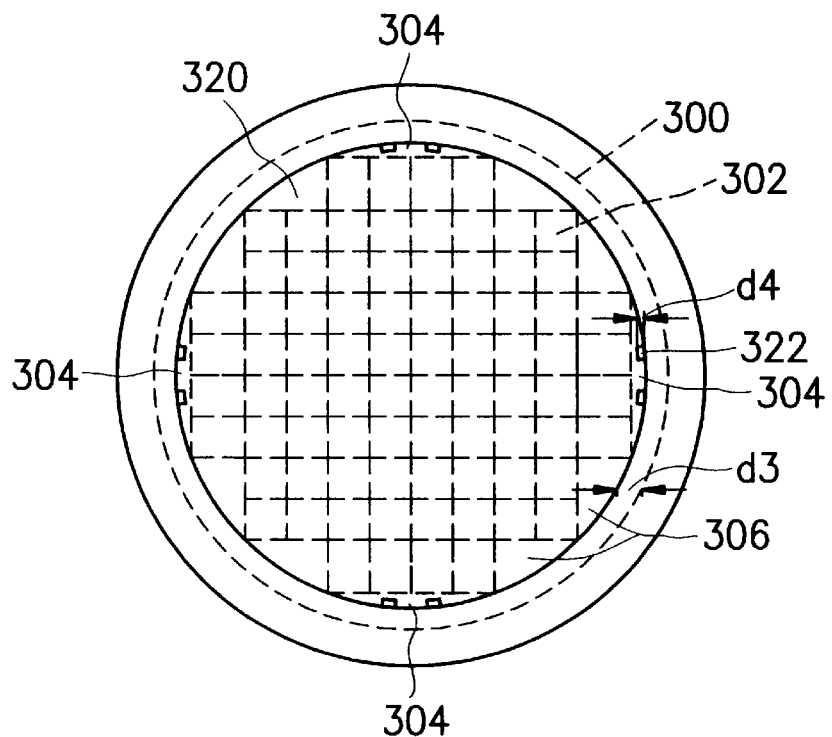
FIG. 3 is a schematic diagram showing the clamp of a preferred embodiment according to the invention.

The invention provides a new clamp for affixing a wafer during an etching process, as shown in FIG. 3.

Referring to FIG. 3, the radius of the inner surface of the clamp 320 for affixing a wafer 300 is about 1 mm shorter than the radius of the wafer 300. That is, the distance d3 between the inner surface of the clamp ring 320 and the edge of the wafer 300 is about 1 mm. The clamp 320 ring entirely covers the area on the wafer 300 that is near the edge of the wafer 300 without blocking the device regions 302.

In addition, there are four square protuberances or four pairs of square protuberances 322 distributed evenly along the inner surface of the clamp ring 320, wherein the square protuberances 322 are high about 1 mm, d4, measured from the inner surface of the clamp ring 320. In the presence of a wafer, those square protuberances 322 are placed on an area 304 of the wafer 300 that is outside of the device regions 302. The tangents on the locations of the square protuberances 322 are parallel to the edge of the device regions 302. So, even the space 306 on the wafer 300 is used as additional device regions according to the increasing of the integration in the future, those square protuberances 322 can still stay outside of the device regions 302. Because circuit layout is normally in the shape of square, the area 304 beside the device regions 302 is not used as additional device regions in the future. Moreover, because the square shape of those square protuberances 322 improves the equability of plasma in an etching process, the yield is increased. Even though the wafer 300 is slightly off position, the square protuberances 322 are still able to affix the wafer 300 properly. In addition, the lifetime of the clamp of the invention is about 100 hours, which is two times of a conventional clamp, so that the cost is reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A clamp used in an etching chamber for affixing a wafer, the clamp comprising:

a clamp ring for affixing the wafer, wherein a radius of an inner surface of the clamp ring is shorter than a radius of the wafer; and a plurality of square protuberances, located on the inner surface of the clamp ring and extending inward from the inner surface of the clamp ring.

2. The clamp of claim 1, wherein the radius of an inner surface of the clamp ring is shorter than the radius of the wafer by about 1 mm.

3. The clamp of claim 1, wherein the square protuberances are high about 1 mm measured from the inner surface of the clamp ring.

4. The clamp of the claim 1, wherein the square protuberances are placed around the wafer evenly.

5. The clamp of claim 1, wherein the square protuberances are placed on a plurality of unused areas of the wafer.

6. A clamp used in an etching chamber for affixing a wafer and protect a edge of the wafer, the clamp comprising:

a clamp ring for affixing the wafer, wherein a radius of an inner surface of the clamp ring is shorter than a radius of the wafer; and a plurality of square protuberances, located on the inner surface of the clamp ring and extending inward from the inner surface of the clamp ring.

7. The clamp of claim 6, wherein the radius of an inner surface of the clamp ring is shorter than the radius of the wafer by about 1 mm.

8. The clamp of claim 6, wherein the square protuberances are high about 1 mm measured from the inner surface of the clamp ring.

9. The clamp of the claim 6, wherein the square protuberances are placed around the wafer evenly.

10. The clamp of claim 6, wherein the square protuberances are placed on a plurality of unused areas of the wafer.

* * * * *